(12) United States Patent
Pietambaram et al.

(10) Patent No.: US 10,170,428 B2
(45) Date of Patent: Jan. 1, 2019

(54) CAVITY GENERATION FOR EMBEDDED INTERCONNECT BRIDGES UTILIZING TEMPORARY STRUCTURES

(71) Applicant: Intel Corporation, Santa Clara, CA (US)

(72) Inventors: Srinivas V. Pietambaram, Gilbert, AZ (US); Rahul N. Manepalli, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/197,577

(22) Filed: Jun. 29, 2016

(65) Prior Publication Data

US 2018/0005945 A1  Jan. 4, 2018

(51) Int. Cl.
| | |
|---|---|
| *H01L 23/538* | (2006.01) |
| *H01L 23/00* | (2006.01) |
| *H01L 23/522* | (2006.01) |
| *H01L 25/00* | (2006.01) |
| *H01L 25/065* | (2006.01) |
| *H01L 23/528* | (2006.01) |

(52) U.S. Cl.
CPC ...... *H01L 23/5381* (2013.01); *H01L 23/5226* (2013.01); *H01L 23/5283* (2013.01); *H01L 24/11* (2013.01); *H01L 24/17* (2013.01); *H01L 25/0655* (2013.01); *H01L 25/50* (2013.01); *H01L 2224/16227* (2013.01); *H01L 2224/16235* (2013.01); *H01L 2924/15192* (2013.01)

(58) Field of Classification Search
USPC .................. 438/107, 126, 462, 667; 257/686
See application file for complete search history.

(56) References Cited

U.S. PATENT DOCUMENTS

| | | | | |
|---|---|---|---|---|
| 6,492,227 | B1 * | 12/2002 | Wang ................ | H01L 21/28273 257/E21.209 |
| 7,585,785 | B2 * | 9/2009 | Kirchhoff ........... | H01L 21/7682 257/632 |
| 8,901,748 | B2 * | 12/2014 | Manusharow ...... | H01L 25/0655 257/652 |
| 8,916,981 | B2 * | 12/2014 | Xiu ....................... | H01L 23/293 257/788 |

(Continued)

OTHER PUBLICATIONS

Mahajan et al. "Embedded Multi-Die Interconnect Bridge (EMIB)—A High Density, High Bandwidth Packaging Interconnect", May 2016, IEEE, pp. 557-565.*

(Continued)

*Primary Examiner* — Telly Green
(74) *Attorney, Agent, or Firm* — Schwabe, Williamson & Wyatt, P.C.

(57) ABSTRACT

Embodiments are generally directed to cavity generation for an embedded interconnect bridge utilizing a temporary structure. An embodiment of a package includes a substrate; a silicon interconnect bridge including a plurality of interconnections, the interconnect bridge being embedded in the substrate; and a plurality of contacts on a surface of the substrate, the plurality of contacts being coupled with the plurality of interconnections of the interconnect bridge. The interconnect bridge is bonded in a cavity in the substrate, the cavity being formed by removal of at least one temporary structure from the substrate.

12 Claims, 17 Drawing Sheets

DFR Strip, Seed Layer Etching

Removal of Temporary Structures

(56) References Cited

U.S. PATENT DOCUMENTS

| | | | | |
|---|---|---|---|---|
| 8,946,900 B2* | 2/2015 | Qian | ................. | H01L 23/49827 257/531 |
| 9,041,205 B2* | 5/2015 | Karhade | ............... | H01L 23/538 257/690 |
| 9,177,831 B2* | 11/2015 | Chiu | ....................... | H01L 23/15 |
| 9,240,377 B2* | 1/2016 | Qian | ................. | H01L 23/49827 |
| 9,391,025 B2* | 7/2016 | Karhade | ............... | H01L 23/538 |
| 2005/0124172 A1* | 6/2005 | Townsend, III | .... | H01L 21/0271 438/780 |
| 2006/0292892 A1* | 12/2006 | Kirchhoff | .......... | H01L 21/7682 438/780 |
| 2014/0117552 A1* | 5/2014 | Qian | ................. | H01L 23/49827 257/762 |
| 2014/0264791 A1* | 9/2014 | Manusharow | ...... | H01L 25/0655 257/666 |
| 2014/0332966 A1* | 11/2014 | Xiu | ....................... | H01L 23/293 257/773 |
| 2015/0001717 A1* | 1/2015 | Karhade | ................. | H01L 24/17 257/741 |
| 2015/0001733 A1* | 1/2015 | Karhade | ............... | H01L 23/538 257/774 |
| 2015/0091182 A1* | 4/2015 | Chiu | ....................... | H01L 23/15 257/774 |
| 2015/0102477 A1* | 4/2015 | Qian | ................. | H01L 23/49827 257/676 |
| 2015/0228583 A1* | 8/2015 | Karhade | ............... | H01L 23/538 257/774 |
| 2016/0043056 A1* | 2/2016 | Chiu | ....................... | H01L 23/15 257/741 |
| 2016/0060097 A1* | 3/2016 | Zhang | .................. | H01L 41/113 257/618 |
| 2016/0085899 A1* | 3/2016 | Qian | ................... | G06F 17/5077 257/774 |
| 2016/0300796 A1* | 10/2016 | Karhade | ............... | H01L 23/538 |

OTHER PUBLICATIONS

Intel Custom Foundry EMIB, "Embedded Multi-Die Interconnect Bridge", Intel Corporation, Oct. 1, 2015, 7 pages.

INTELPR, "Intel Announces New Packaging and Test Technologies for Foundry Customers", Intel Newsroom, Aug. 27, 2014, 1 page, Santa Clara, CA.

* cited by examiner

*Fabricate Substrate*

*Cavity Formation*

Si Bridge Die Bonding into Cavities

Lamination of Dielectric Material

*VIA Drilling*

*SAP Lithography*

*Solder Resist*

*Surface Finish*

*Lamination of Dielectric Material*

*Dielectric Material Encapsulation*

*Electroless Seed Layer Deposition*

*DFR Lamination, Expose, Develop*

*Electrolytic Cu Plating*

*DFR Strip, Seed Layer Etching*

*Removal of Temporary Structures*

*Remaining Dielectric Material Removal*

*Si Bridge Die Bonding into Cavity*

*Lamination of Next Dielectric Material*

*VIA Drilling*

*SAP Lithography*

*Solder Resist*

*Selective Surface Finish*

*Laser Cutting of Dielectric*

*Removal of Temporary Structures*

US 10,170,428 B2

CAVITY GENERATION FOR EMBEDDED INTERCONNECT BRIDGES UTILIZING TEMPORARY STRUCTURES

TECHNICAL FIELD

Embodiments described herein generally relate to the field of electronic devices and, more particularly, cavity generation for an embedded interconnect bridge utilizing a temporary structure.

BACKGROUND

In the fabrication of electronic devices, the interface of devices with other devices becomes more challenging as the device structure increases in speed and complexity. One structure that is utilized to provide an in-package high density interconnect of dies is the Embedded Multi-Die Interconnect Bridge (EMIB) of Intel Corporation.

An embedded interconnect bridge is fabricated in a package, with the technology allowing for construction of high density interconnects between heterogeneous dies on a small package. Instead of requiring an expensive silicon interposer with TSV (through silicon via), a small silicon bridge chip may be embedded in a package, enabling very high density die-to-die connections only where needed. Standard flip-chip assembly may then be used to provide robust power delivery and to connect high-speed signals directly from chip to the package substrate.

However, the fabrication of such an interconnect bridge chip requires the generation of cavities for the embedding of dies within the structure. The formation of such cavities generally requires laser drilling in the package substrate, which is a time consuming and expensive process and thus adds significantly to overall cost and complexity of the fabrication process.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Figure 1:
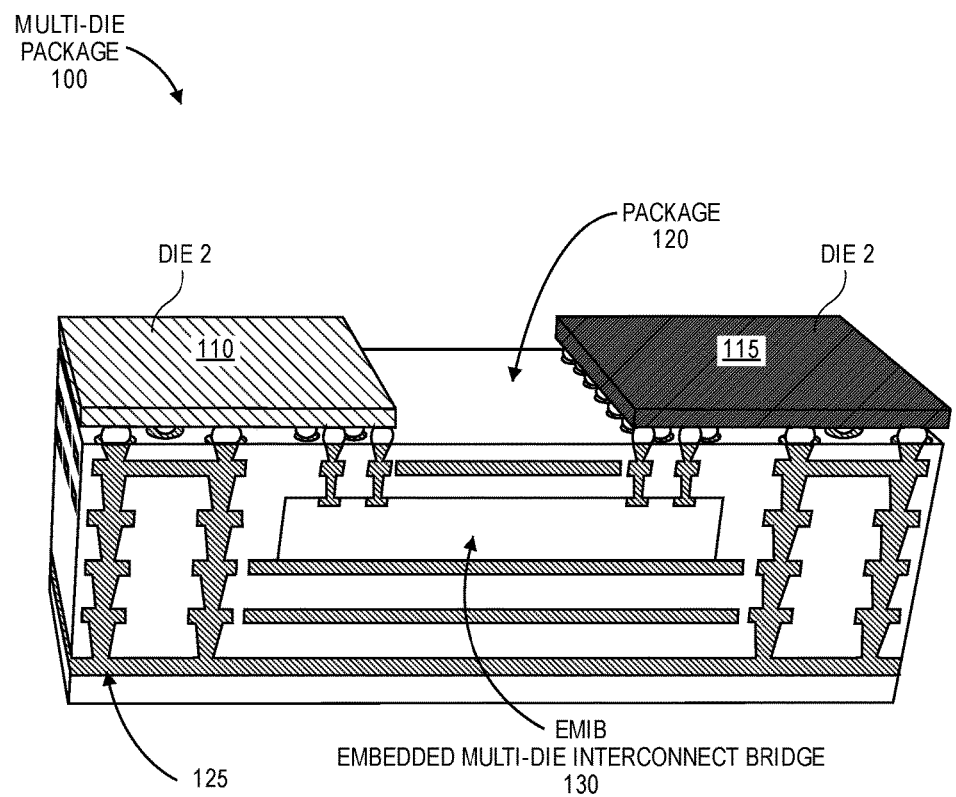
FIG. 1 is an illustration of a multi-die package coupled utilizing an embedded interconnect bridge according to an embodiment.

Embodiments described herein are generally directed to cavity generation for an embedded interconnect bridge utilizing temporary structures.

For the purposes of this description, the following definitions apply:

"Embedded interconnects" refers to interconnects that are embedded within a substrate. Embedded interconnects include, but is not limited to, the Embedded Multi-Die Interconnect Bridge (EMIB) of Intel Corporation. An Embedded Multi-Die Interconnect Bridge is generally referred to as an EMIB or interconnect bridge herein.

"Sacrificial material" refers to a material that decomposes when subjected to certain conditions, wherein the conditions may include, but are not limited to, application of heat, light, including light within a certain frequency range, or solvent application.

"Temporary structure" or "spacer" means a material that is removable from a fabricated apparatus. Removing the temporary structure or spacer may include, but is not limited to, changing the form of the temporary structure, which changing the form of the temporary structure may include decomposes the temporary structure at least in part. A temporary structure includes, but is not limited to, sacrificial material.

"Through silicon via" or "TSV" refers to a vertical (perpendicular to a surface) electrical connection (or via) that passes through a silicon wafer or die.

High bandwidth interconnects on multi-die packages are becoming increasingly necessary for high performance computing in order provide sufficient data transfer between dies. In particular, EMIB technology provides significant cost and design flexibility advantages to provide communication interconnects between dies.

An EMIB provides a high density interconnect within a package for connection of heterogeneous dies, wherein the EMIB includes a fine network of metal and dielectric layers, the layers being embedded below a surface of a substrate, with bump contacts above the metal and dielectric layers for connection of dies.

In applying EMIB technology for a multi-die package, instead of requiring an expensive silicon interposer with TSVs (through silicon vias), a small silicon bridge chip is embedded in a package, enabling very high density die-to-die connections only where needed. Standard flip-chip assembly then may be applied for robust power delivery and to connect high-speed signals directly from die to the package substrate.

However, the fabrication of a package including an interconnect bridge chip such as EMIB requires the formation of cavities for the embedding of bridge dies within the package substrate. The typical process for generation of such cavities utilizes laser drilling, which is a time consuming and expensive process, therefore increasing the overall cost of fabrication of a package. Because of the significant laser processing required, the conventional fabrication of cavities in the package for embedding interconnect bridge chips is largely a serial process, thereby creating a bottleneck in the production of such package substrates.

In some embodiments, a process provides for cavity generation for an embedded interconnect bridge utilizing removal of temporary structures or spacers, thereby providing a high throughput, low cost cavity creation method as an alternative to the high cost laser drill processes in conventional fabrication, thus providing significant cost savings in the fabrication of an EMIB, and in the overall cost for fabrication of a multi-die package. In a particular example, a temporary structure or spacer includes sacrificial material.

In some embodiments, at least one temporary structure is encapsulated by dielectric material in the fabrication of an interconnect bridge. In some embodiments, the temporary structure is removed, resulting in the generation of one or more cavities. In some embodiments, the removal of the temporary structure may include applying a condition to change a form of the temporary structure to enable removal of the temporary structure. In a particular example, the temporary structure includes sacrificial material, and heat or other decomposition condition for the particular sacrificial material is applied to the package substrate, thereby causing the sacrificial material to decompose, resulting in the generation of one or more hollow cavities. In some embodiments, a vacuum created by the decomposition of the sacrificial material and the resulting expelling of gases may cause remaining dielectric material above the cavities to fall at least in part. In some embodiments, small scale laser drilling or etching may be applied to remove the remaining dielectric material, wherein such drilling or etching is significantly less intensive than the laser drilling or etching required to etch a cavity in a conventional process. In some embodiments, a process may further include laser cutting of dielectric material prior to removal of temporary structure, and further includes picking portions of the dielectric material from the cavities after the removal of the temporary structure.

In addition, the generation of a cavity utilizing removal of temporary structures allows for producing cavity walls that are steeper (i.e., closer to a vertical direction) in comparison with the more tapered walls of cavities that are generated through laser drilling of material. The steeper walls of the cavities created with removal of temporary structures allows for a reduction in wasted space in fabrication, allowing for placing of dies closer together.

FIG. 1 is an illustration of a multi-die package coupled utilizing an embedded interconnect bridge according to an embodiment. FIG. 1 provides a general illustration of a multi-die package including an interconnect bridge, wherein more specific embodiments for the fabrication of the package with interconnect bridge are illustrated in FIGS. 3A to 3P and FIGS. 4A and 4B.

As provided in FIG. 1, a multi-die package 100 includes heterogeneous dies, shown as Die 1 (110) and Die 2 (115), on a single package coupled via an embedded interconnect bridge 130, wherein high density interconnects 125 are provided for the interconnection of such dies.

In some embodiments, an EMIB 130 is embedded within a package to provide high density interconnects between the dies. In some embodiments, the EMIB package is fabricated in a process utilizing a temporary structure to generate a cavity for embedding of an embedded interconnect bridge.

FIGS. 2A-2H illustrate fabrication of a package including an interconnect bridge utilizing conventional cavity construction means. A typical process flow for embedding a silicon interconnect bridge for fine die to die interconnections is shown in FIG. 2A to 2H.

Figure 2A:
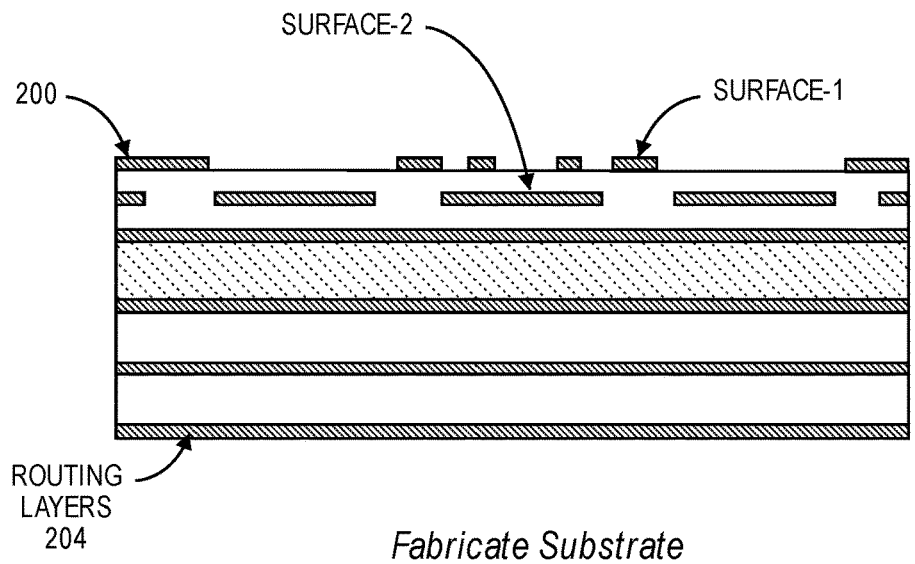
FIGS. 2A-2H illustrate fabrication of a package including an interconnect bridge utilizing conventional cavity construction means.

FIG. 2A: A fabrication process may commence with substrate manufacturing to generate organic substrate 200. The conventional fabrication process produces the layers of the substrate including the Surface-2 and Surface-1 layers. FIG. 2A illustrates a certain number of routing layers 204 for illustration, but a different number of routing layers may exist.

Figure 2B:
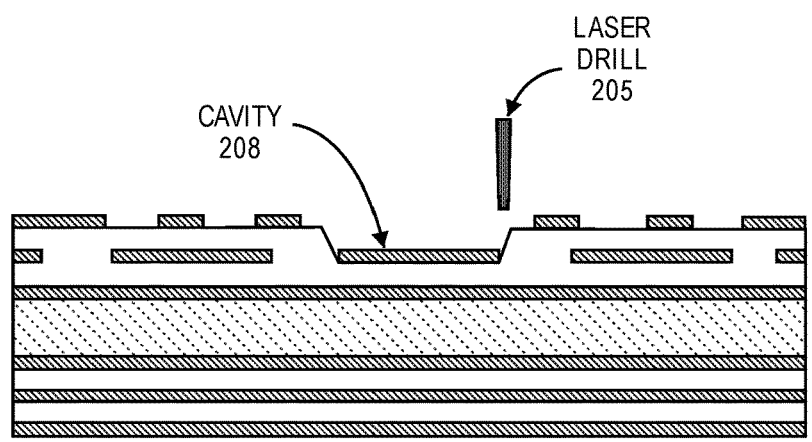

FIG. 2B: A fabrication process may proceed with cavity formation utilizing laser drill 205, shown as a cavity 208. As illustrated, the cavity 208 is formed between surface-1 to surface-2. However, the drilling process utilizing the laser drill 205 is a slow, low throughput, serial and expensive process for the cavity generation.

Figure 2C:
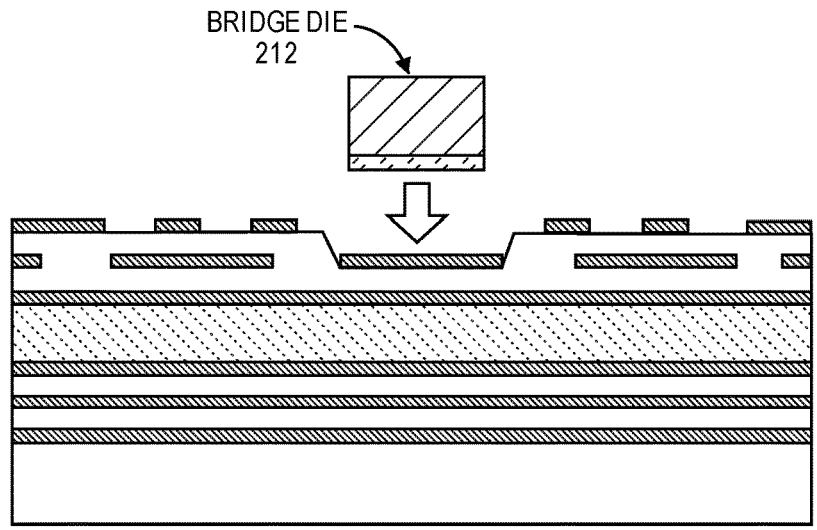

FIG. 2C: A process may continue with silicon bridge die bonding into the drilled cavity, shown as the bonding of a bridge die 212.

Figure 2D:
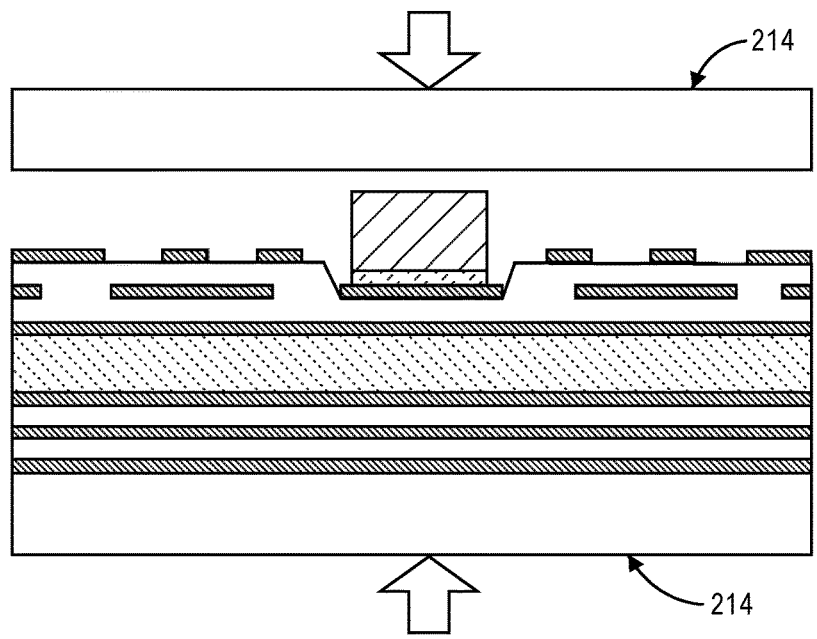

FIG. 2D: A process may proceed with lamination of dielectric material 214, thereby encapsulating the silicon bridge die that is bonded in the cavity.

Figure 2E:
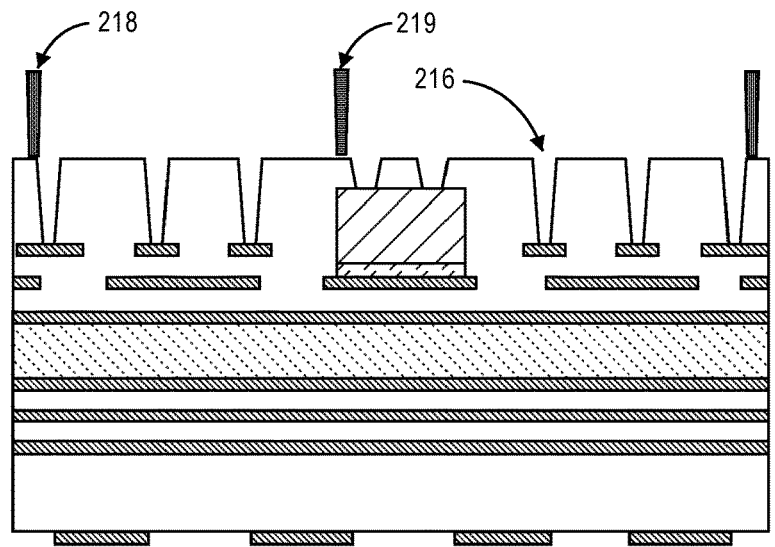

FIG. 2E: A process may include performance of via drilling to form vias 216, which may include operation of $CO_2$ (carbon dioxide) laser 218 for forming POR vias and operation of UV laser 219 for forming higher accuracy vias requiring a smaller pitch.

Figure 2F:
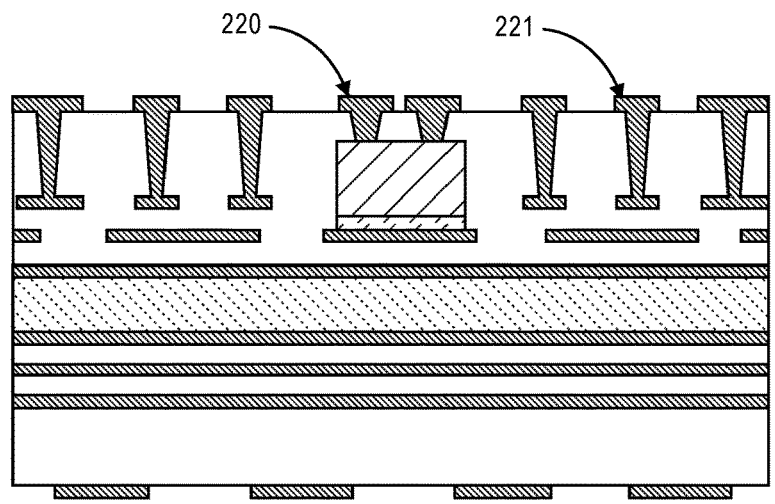

FIG. 2F: A process may include SAP (Semi-Additive Process) lithography to generate via connections, illustrated as connections 220 and 221.

Figure 2G:
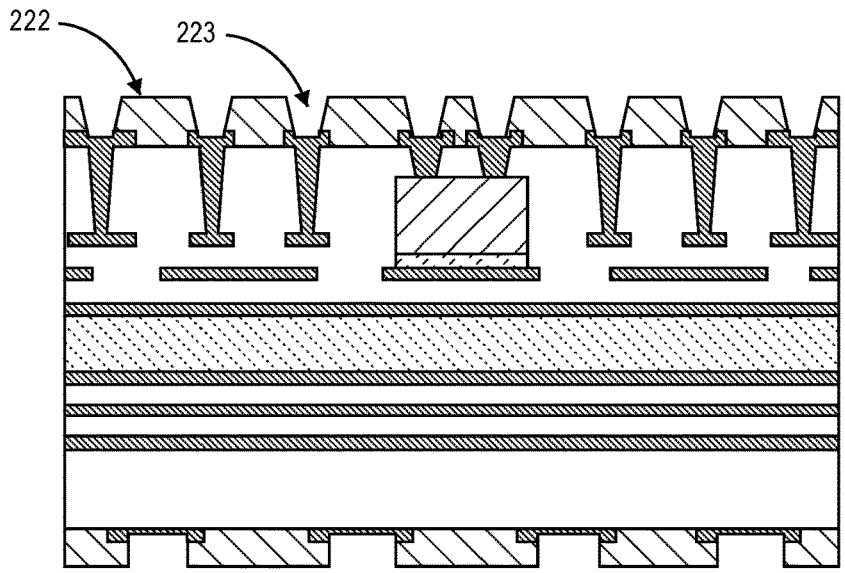

FIG. 2G: A process may continue with application of solder resist 222 on the surface of the package and creation of Solder Resist Openings (SROs) 223 for selective surface finish. Appropriate processes such as Litho or Laser drills are used for creating these openings.

Figure 2H:
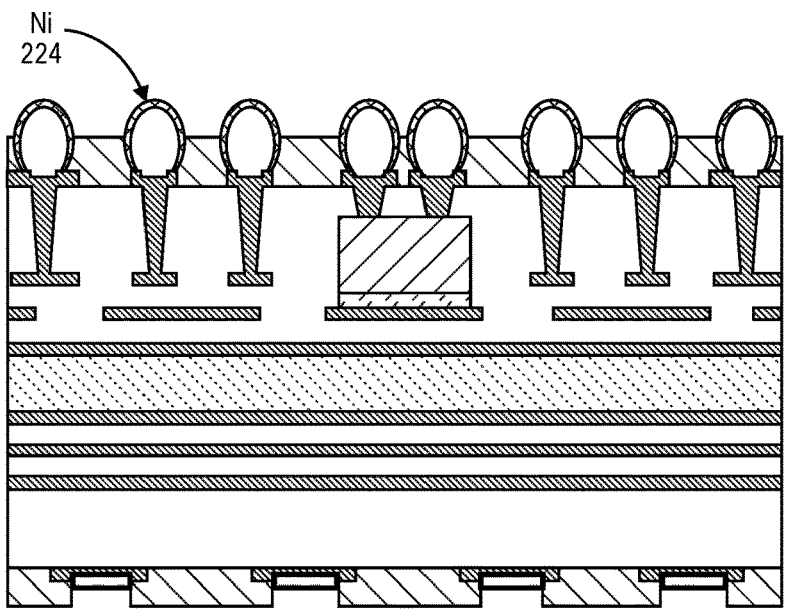

FIG. 2H: A process may include elective surface finish, with thick nickel (Ni) bumps 224 is deposited in the SROs to provide contacts (such as for standard flip-chip coupling) connection to dies and other elements.

The process may then proceed with singulation of the packaged EMIB substrates, O/S testing, and EOL (End of Line) metrology for examination of finished substrates.

In the process illustrated in FIGS. 2A through 2H, cavity creation through laser drilling and surface finishing for multiple sized SROs are key process elements in the process flow for the package fabrication. However, the laser cavity creation is a slow and costly operation, and presents a significant bottleneck in the process flow for fabrication of the EMIB packages. For this reason, an alternative process providing a faster and lower cost cavity creation process is highly desirable.

In some embodiments, in contrast with the conventional approach, a novel and low cost cavity creation process utilizing application and removal of temporary structures is implemented in the fabrication of an EMIB package. In a particular example, a process utilizes sacrificial material that is stencil printed and is later decomposed after dielectric lamination and pad formation, wherein the decomposition is produced with a simple thermal treatment or other decomposition process (depending on the nature of the sacrificial material) creating the cavities needed for silicon bridge bonding in the EMIB package fabrication. In some embodiments, the sacrificial material may also be curtain coated and photo exposed and developed when a tighter cavity tolerance is required. The temporary structure approach for cavity creation provides significant cost savings over the POR laser drilled cavity as multiple cavities can be created using one thermal treatment instead of one by one cavity creation using laser drill.

While an implementations utilizing sacrificial material described herein describe, for example, a sacrificial polymer that decomposes upon the application of heat, embodiments are not limited to use of a particular sacrificial material or particular decomposition process. In certain implementations, a material such as Polynorbornene and/or a polycarbonate-based polymer operates to decompose cleanly when exposed to high temperatures, and such material is available and may be used in a fabrication process.

Figure 3A:
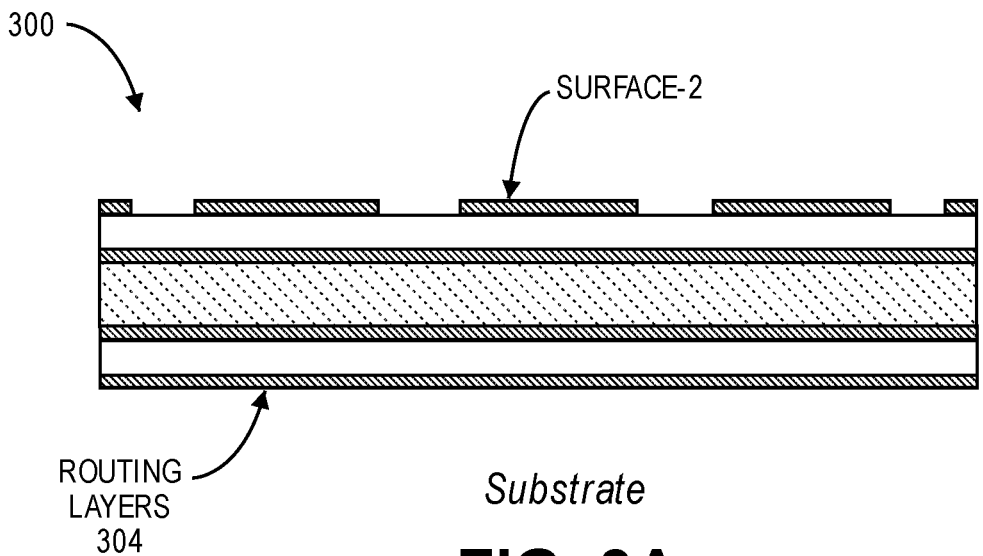
FIGS. 3A-3P illustrate fabrication of a package including an interconnect bridge utilizing a temporary structure to generate a cavity according to an embodiment.
Figure 3B:
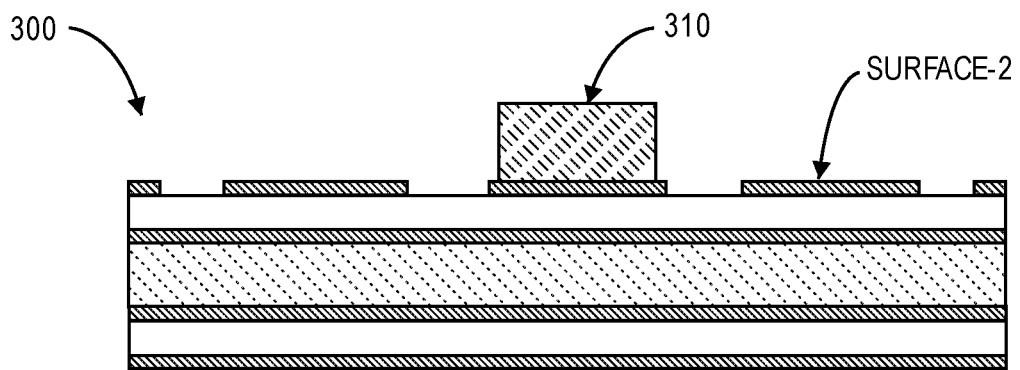
Figure 3C:
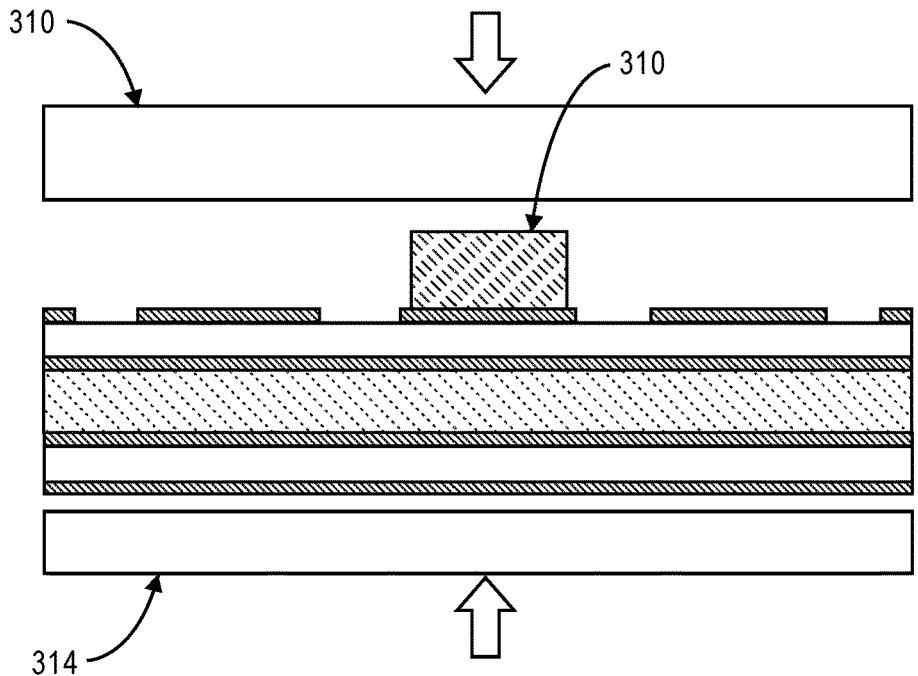
Figure 3D:
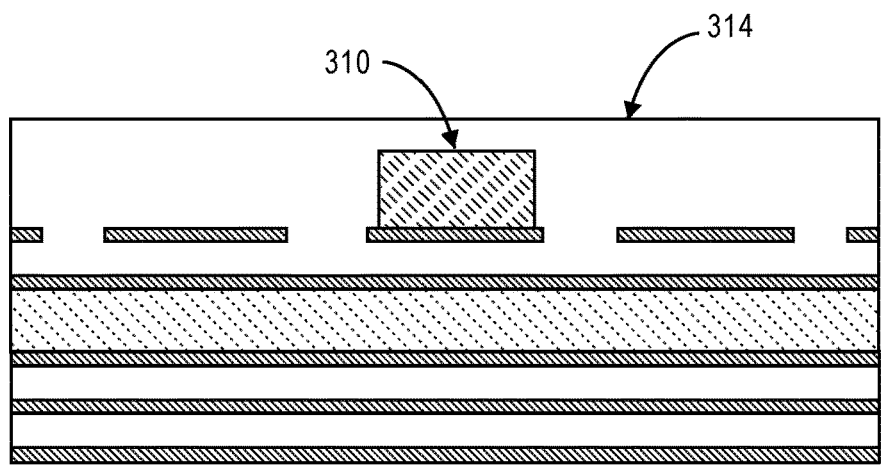
Figure 3E:
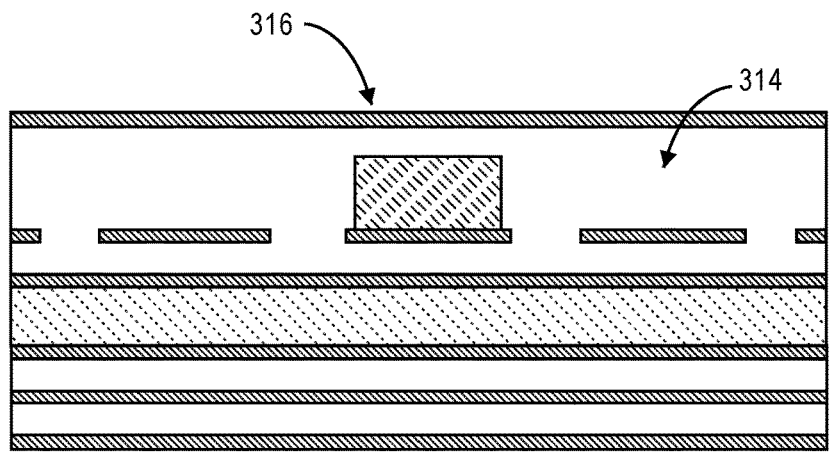
Figure 3F:
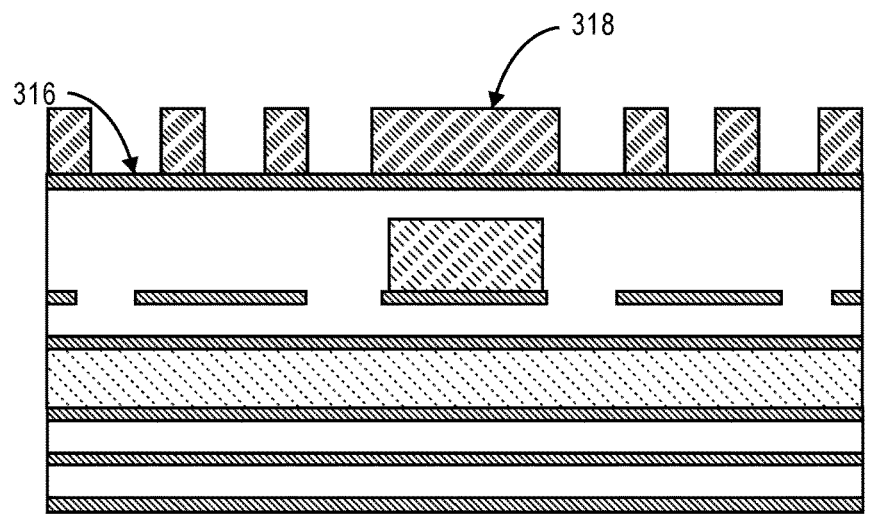
Figure 3G:
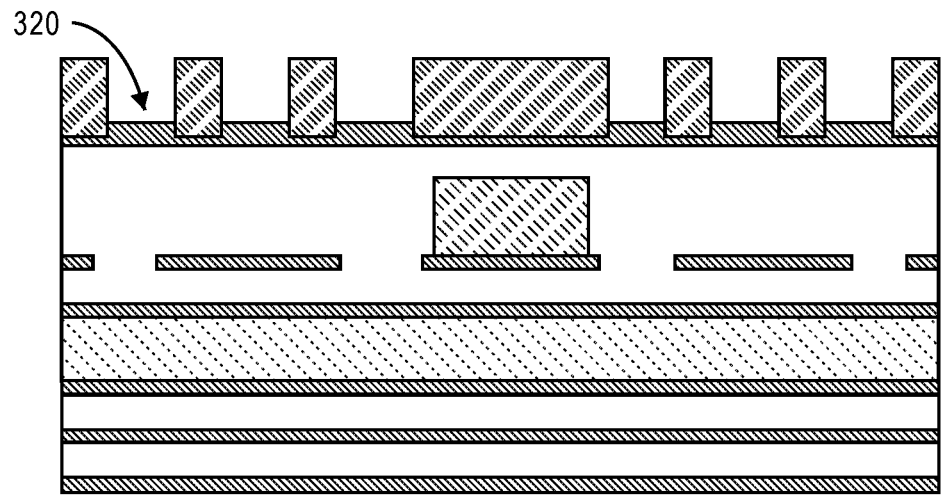
Figure 3H:
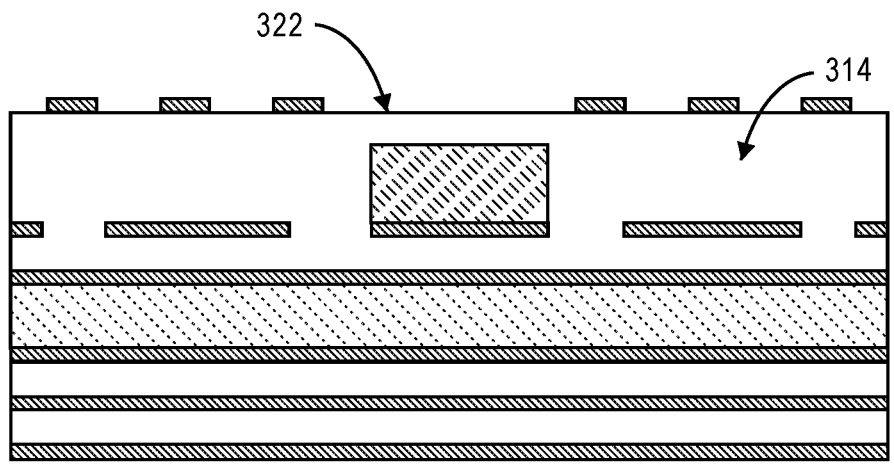
Figure 3I:
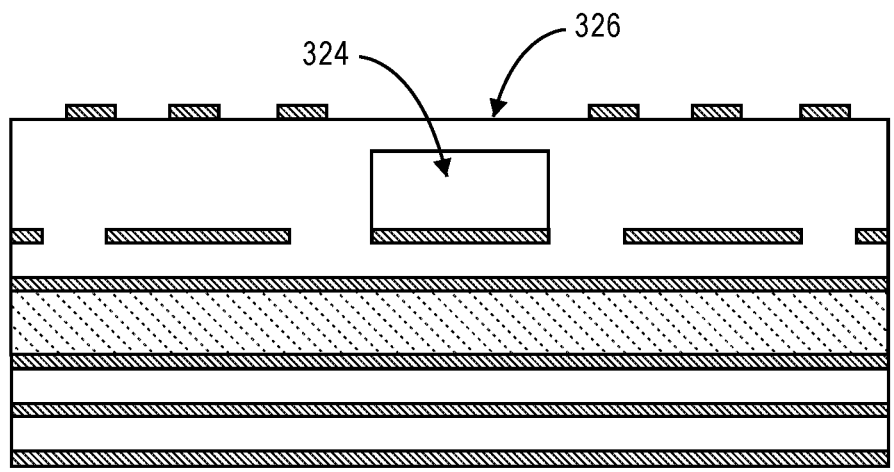
Figure 3J:
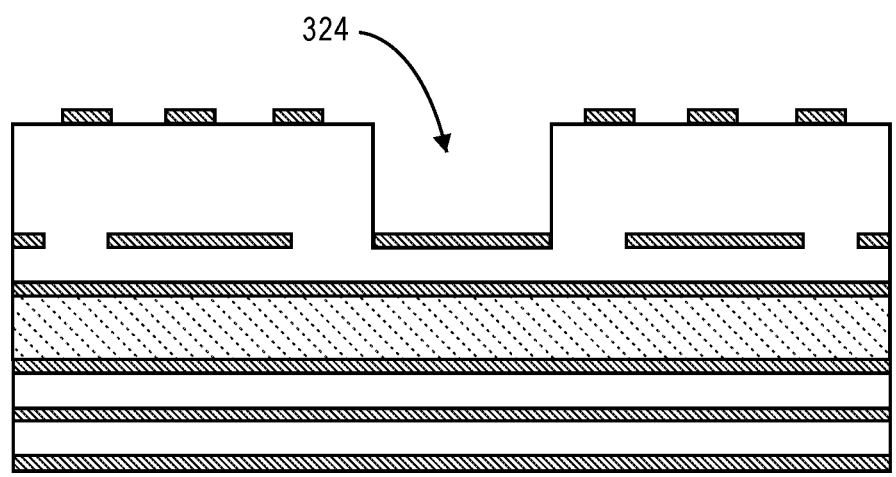
Figure 3K:
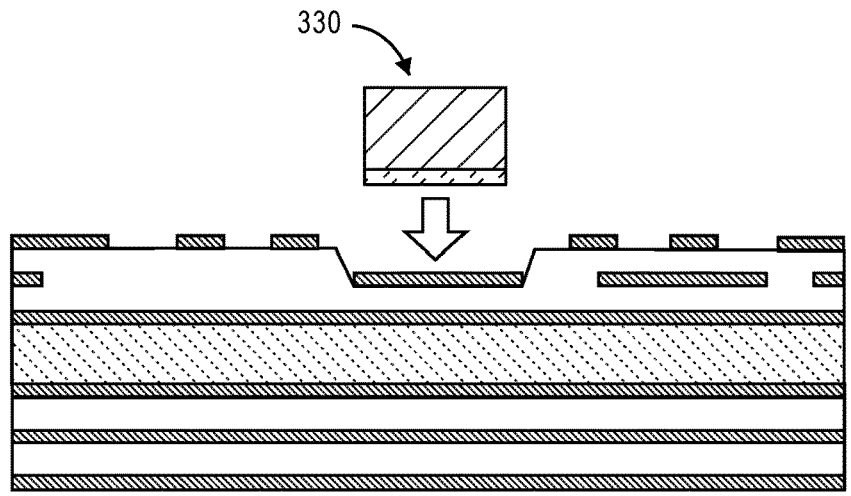
Figure 3L:
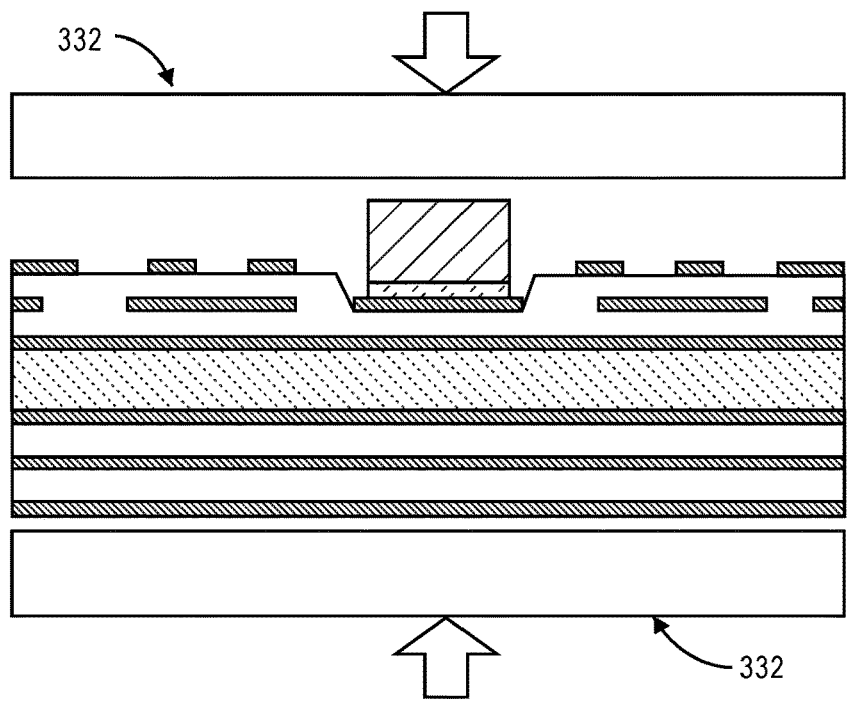
Figure 3M:
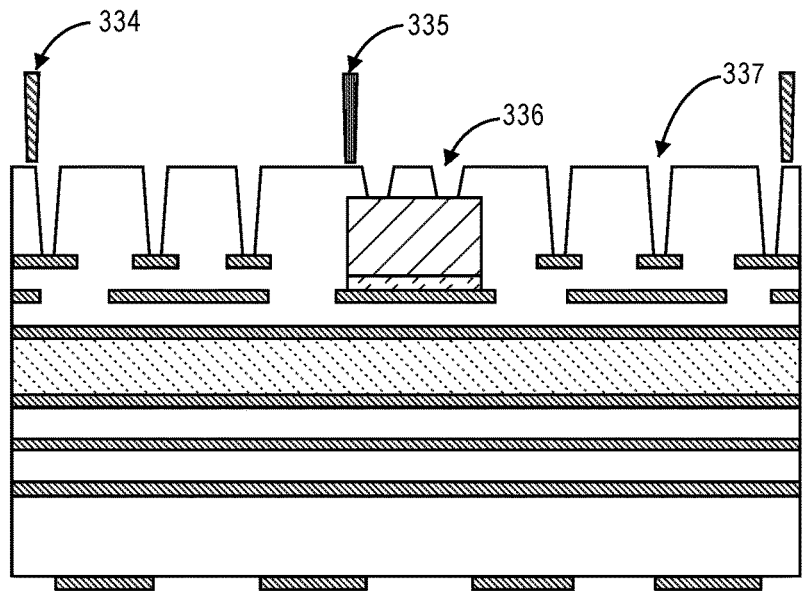
Figure 3N:
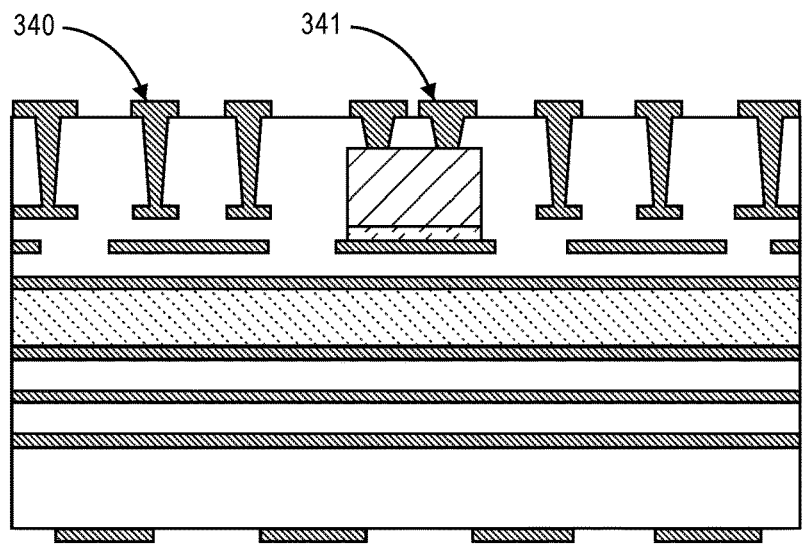
Figure 3O:
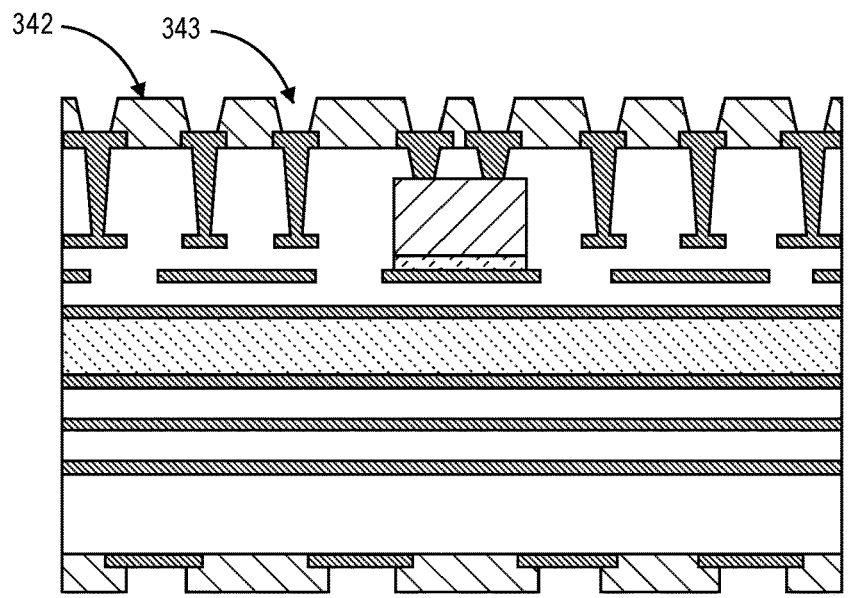
Figure 3P:
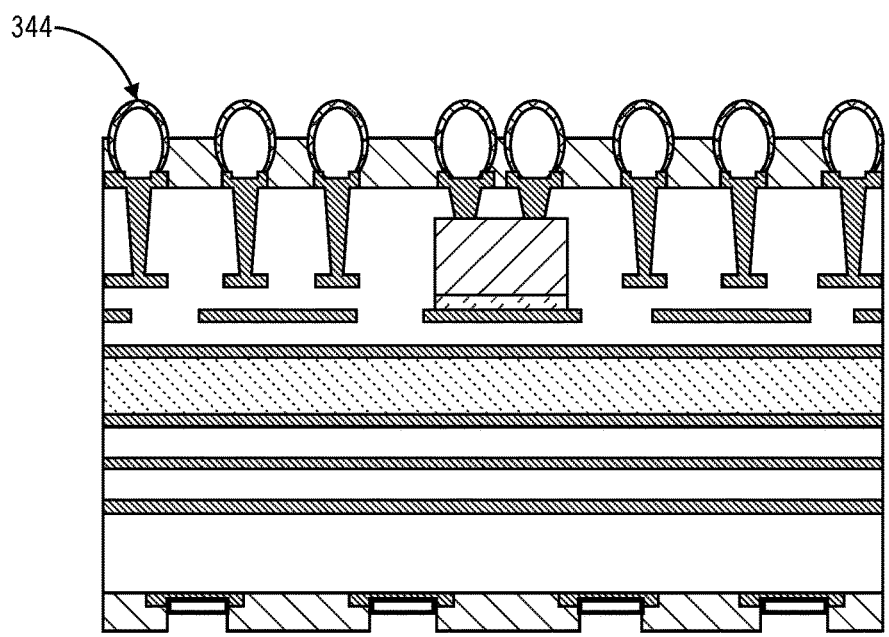

FIGS. 3A-3P illustrate fabrication of a package including an interconnect bridge utilizing a temporary structure to generate a cavity according to an embodiment. In some embodiments, at least one temporary structure is applied where a cavity is required in a package. In a particular example, sacrificial material, which may include a sacrificial polymer or other sacrificial material, may be stencil printed in the areas where a cavity is required in a package. In some embodiments, dielectric material is then laminated to encapsulate the sacrificial polymer, with the next build-up layer being generated with pads. The sacrificial material is then thermally decomposed to gas using a simple thermal treatment or other process to create a hollow cavity.

In the fabrication of a package including a silicon interconnect bridge according to an embodiment:

FIG. 3A: In some embodiments, a substrate 300 including routing layers 304 is generated. As illustrated, the surface-2 layer is provided as a top layer of the substrate.

FIG. 3B: In some embodiments, a temporary structure 310 is applied on the substrate 300 at a location where a cavity is to be created at the surface-2 layer. In an example, a sacrificial material is stencil printed, onto the substrate 300 to provide the temporary structure 310 at a location where a cavity is to be created at the surface-2 layer. In other examples, the sacrificial material may also be curtain coated and photo exposed and developed, for instance, when a tighter cavity tolerance is required. In some embodiments, a temporary structure 310 is applied at a first location, wherein the temporary structure 310 may include a volume of sacrificial material applied in the first location.

FIG. 3C: An embodiment of a process may continue with lamination of dielectric material 314 (which may be referred to as a first dielectric material) to the substrate, including forming of the dielectric material 314 surrounding the temporary structure 310

FIG. 3D: Subsequent to the lamination of the dielectric material 314, an embodiment of a process may result in encapsulating the temporary structure 310 with the dielectric material.

FIG. 3E: An embodiment of a process may continue with electroless seed layer deposition 316 on the surface of the dielectric material 314.

FIG. 3F: An embodiment of a process may further provide for DFR (Dry Film Resist) lamination 318 on the seed layer 316, followed by exposing and developing the DFR layers.

FIG. 3G: An embodiment of a process may include performance of electrolytic Cu (copper) plating to produce a copper layer 320 to create copper pads using the seed layer base.

FIG. 3H: An embodiment of a process may include performance of DFR stripping, resulting in removing the dry film resist, and resulting in the etching 322 of the surface layer to expose the dielectric material 314.

FIG. 3I: An embodiment of a process may include removing the temporary structure to create a cavity 324 within the package substrates. In some embodiments, removing the temporary structure includes applying a condition to change a form of the temporary structure for removal. In a particular example of the temporary structure including sacrificial material, removing the sacrificial material includes applying a decomposition condition, such as applying a thermal treatment, to decompose the sacrificial material and create a cavity 324 within the device. A thin layer of dielectric material 326 may remain above the cavity after the removal process, or may be in part collapsed due to the removal of the temporary structure, such as a vacuum generated by the decomposition of sacrificial material and the resulting expelling of gas formed by such decomposition.

FIG. 3J: An embodiment of a process may include removal of the remainder of the dielectric material on top of the cavity 324 resulting from the removal of the temporary structure, wherein removal of the remainder of the dielectric includes, but is not limited to, laser drilling or etch back, wherein the laser operation is significantly less intensive than the laser drilling for generation of a cavity required in a conventional process. Removal of dielectric material in an alternative embodiment may include removal of material collapsed into the cavities as illustrated in FIG. 4B.

FIG. 3K: An embodiment of a process may include bonding of silicon bridge die element 330 into the cavity formed by the removal of the temporary structure.

FIG. 3L: An embodiment of a process may include laminating a next layer of dielectric material 332 (which may be referred to as a second dielectric material) on the substrate, thereby embedding the bonded silicon bridge die.

FIG. 3M: An embodiment of a process may further include drilling of vias, which may include use of a CO2 laser 334 for drilling for POR vias 336 and UV laser 335 for drilling of higher accuracy vias 337 at a smaller pitch.

FIG. 3N: An embodiment of a process includes SAP (Semi-Additive Process) lithography to generate the via connections 340 and 341.

FIG. 3O: An embodiment of a process continues with application of solder resist 342 and creation of Solder Resist Openings (SROs) 343 for selective surface finish. Appropriate processes such as Litho or Laser drills are used for creating these openings.

FIG. 3P: An embodiment of a process may proceed with selective surface finish with thick nickel (Ni) bumps 344 deposited in the SROs to connect dies and other elements via the interconnect bridge embedded in the package. In some embodiments, the contacts are contacts for flip-chip coupling of one or more dies.

Figure 4A:
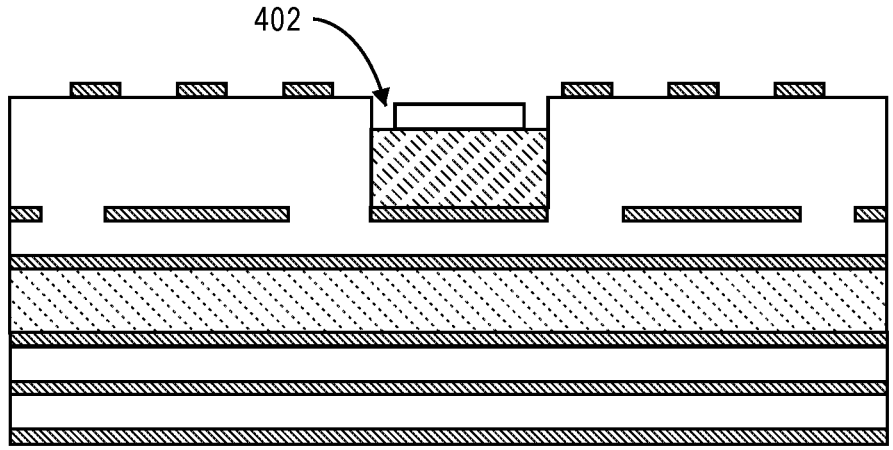
FIGS. 4A and 4B illustrate fabrication of a package including an interconnect bridge utilizing a temporary structure to generate a cavity according to an alternative embodiment.
Figure 4B:
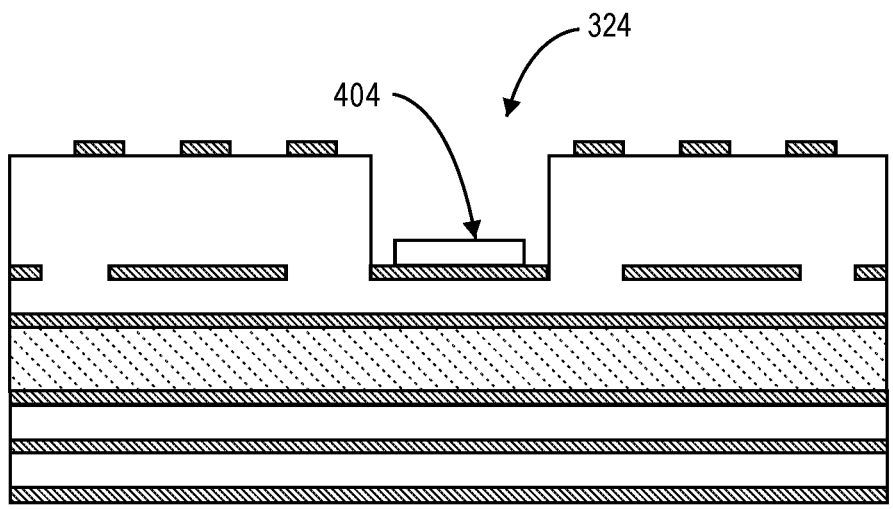

FIGS. 4A and 4B illustrate fabrication of a package including an interconnect bridge utilizing a temporary structure to generate a cavity according to an alternative embodiment. In some embodiments, a process includes laser cutting of dielectric material to partially expose the temporary structure, thus allowing for collapse of dielectric material with removal of the temporary structure, and simplification of the process of removing excess dielectric material.

In some embodiments, subsequent to the processing as illustrated in FIG. 3H (DFR stripping and seed layer etching), fabrication of a package including an interconnect bridge according to an embodiment includes the following:

FIG. 4A: In some embodiments, dielectric material above the temporary structure (as illustrated in FIG. 3H) is cut by laser to generate gaps 402 around the dielectric material. In this manner, the temporary structure is partially exposed.

FIG. 4B: In some embodiments, the temporary structure is removed to create an open cavity 324 within the device. In some embodiments, removing the temporary structure includes applying a condition to change a form of the temporary structure for removal, wherein the condition may include the application of heat. In an example, a decomposition condition, such as applying a thermal treatment, may be application to decompose sacrificial material and create the open cavities 324. In this implementation, remaining dielectric material 404 may then collapse within the cavities 324.

In some embodiments, fabrication of the interconnect bridge may continue as illustrated in FIG. 3J, wherein the remaining dielectric material is removed. In some embodiments, the remaining dielectric material 404 may be picked up using a pickup head to create the desired cavity. In some embodiments, a solution based cleaning can be applied.

Embodiments are not limited to the processes illustrated in FIGS. 3A-3P and 4A to 4B, and may include additional or different processes. Further, embodiments are not limited to order of processes illustrated in FIGS. 3A-3P and 4A to 4B.

Figure 5A:
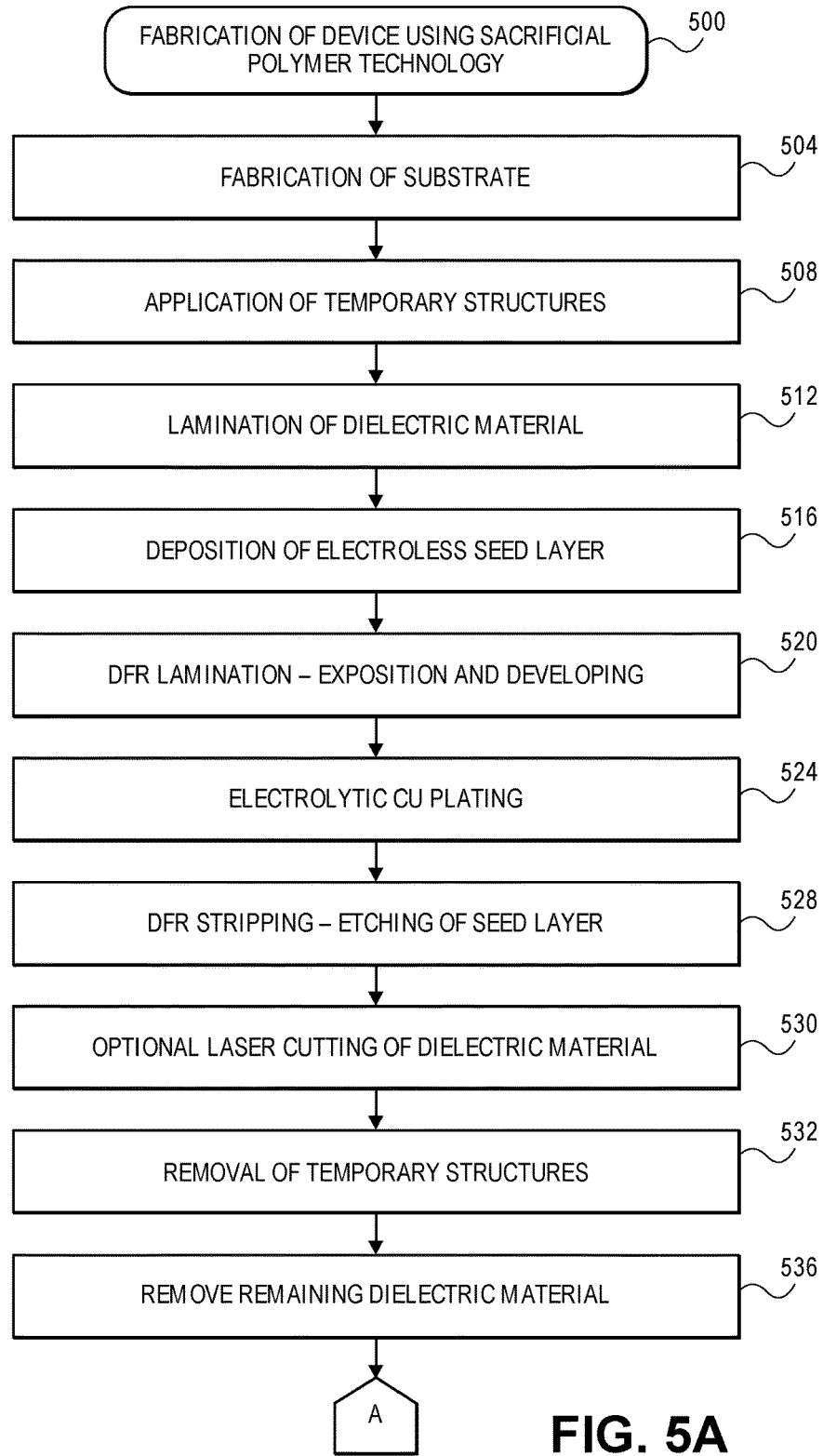
FIGS. 5A and 5B provide a flowchart to illustrate fabrication of an interconnect bridge on a silicon substrate utilizing a temporary structure for cavity generation according to an embodiment.
Figure 5B:
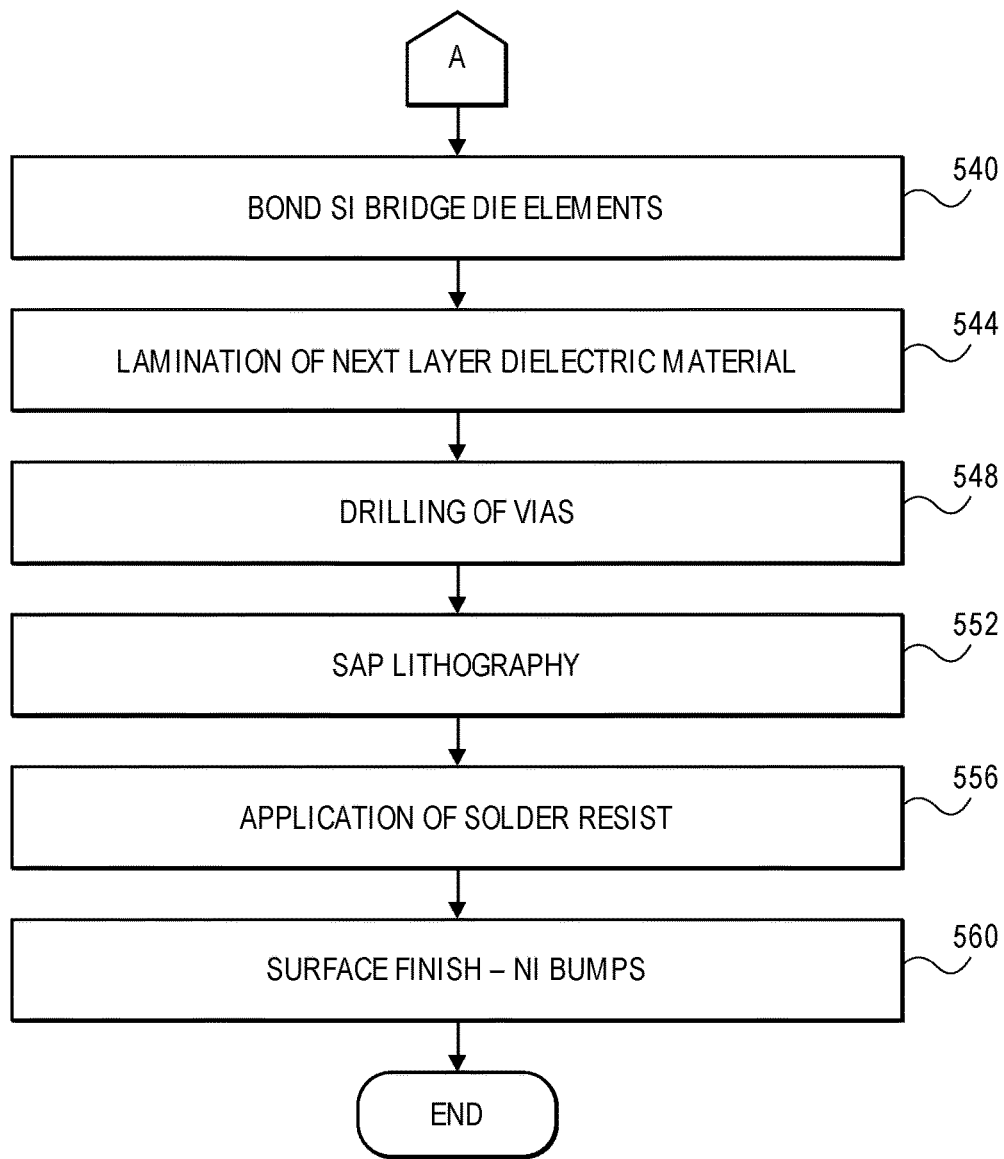

FIGS. 5A and 5B provide a flowchart to illustrate fabrication of an interconnect bridge on an organic package substrate utilizing a temporary structure for cavity generation according to an embodiment.

In some embodiments, a fabrication process 500 may include the following as illustrated in FIG. 5A:

504: Fabrication of substrate including routing layers.

508: In some embodiments, the process further includes application of one or more temporary structures for cavity generation. In an example, application of temporary structures may include applying, such as stencil printing or photo-defining, of sacrificial material to provide sacrificial material for cavity generation.

512: Laminating dielectric material (such as a first dielectric material) to the substrate.

516: The process continues with electroless seed layer deposition.

520: The process then provides for DFR (Dry Film Resist) lamination 318, followed by exposing and developing the layers.

524: Electrolytic Cu (copper) plating is provided to produce copper contacts.

528: DFR stripping is performed to provide for etching of the seed layer.

530: In some embodiments, a process may optionally include laser cutting of the dielectric material, such as illustrated in FIG. 4A 532: In some embodiments, the process includes removal of the one or more temporary structures, which may include applying a condition to change a form of the temporary structures for removal. For example, a thermal treatment may be performed to decompose sacrificial polymer and create cavities.

536: Removing remainder of the dielectric material. In some embodiments, the removal of the remaining dielectric material may include laser drilling or etch back, such as to remove remaining material as illustrated in FIG. 3I. In some embodiments, the remaining dielectric material may be removed by a pickup tool, such as to remove collapsed dielectric material as illustrated in FIG. 4B.

As the continued process is illustrated in FIG. 5B:

540: Bonding silicon bridge die elements into the cavities formed by the removal of the temporary structures.

544: Laminating a next layer of dielectric material (which may be referred to as a second dielectric material).

548: Drilling of vias, including use of CO2 laser and/or UV laser.

552: Performing SAP lithography to generate via connections.

556: Applying solder resist to the surface of the device.

560: Selective surface finish with Ni bumps for connections.

Figure 6:
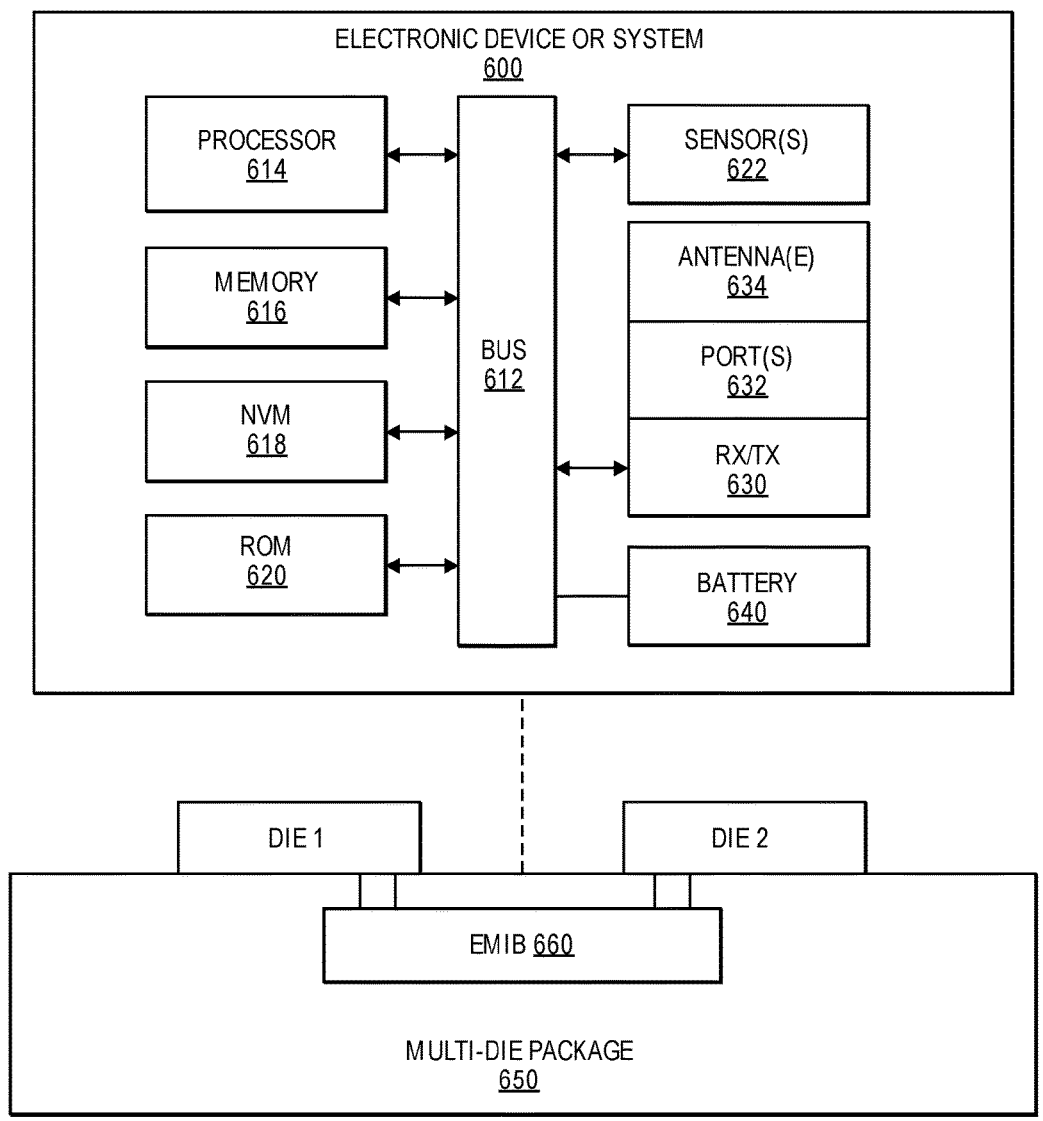
FIG. 6 is an illustration of components of an electronic device or system including a multi-die package according to an embodiment.

FIG. 6 is an illustration of components of an electronic device or system including a multi-die package according to an embodiment. In some embodiments, an electronic device or system 600 includes a multi-die package 650, wherein the multi-die package 650 provide high density interconnects between a first die (Die 1) and a second die (Die 2) via an EMIB 660. In some embodiments, the multi-die package 650 including EMIB 660 is fabricated utilizing a temporary structure removal process, such as, for example, a process as illustrated at least in part in FIGS. 3A to 3P and FIGS. 4A and 4B. An electronic device or system may include, but is not limited to, a mobile device, such as a smartphone, smartwatch, tablet computer, notebook or laptop computer, handheld computer, mobile Internet device, wearable technology, or other mobile electronic device.

In some embodiments, the electronic device or system 600 may include one or more processors 614 coupled to one or more buses or interconnects, shown in general as bus 612. In some embodiments, the bus 612 is a communication means for transmission of data. The bus 612 is illustrated as a single bus for simplicity, but may represent multiple different interconnects or buses, and the component connections to such interconnects or buses may vary. The bus 612 shown in FIG. 6 is an abstraction that represents any one or more separate physical buses, point-to-point connections, or both connected by appropriate bridges, adapters, or controllers.

In some embodiments, the device or system 600 further comprises a memory 616 for storing information and instructions to be executed by the processor 614. Memory 616 may include, but is not limited to, dynamic random access memory (DRAM). The device or system 600 also include non-volatile memory (NVM) 618, and may further include a read only memory (ROM) 620 or other static storage device for storing static information and instructions.

In some embodiments, the device or system 600 may include one or more transmitters or receivers 630 coupled to the bus 612 for wireless or wired communication of data. In some embodiments, the device or system 600 may include one or more ports 632 for the transmission and reception of data via wired communications and one or more antennae 634 for the for the transmission and reception of data via wireless communication. Wireless communication includes, but is not limited to, Wi-Fi, Bluetooth™, near field communication, and other wireless communication standards.

In some embodiments, the device or system 600 may include one or more sensors 622 to sense environmental factors, wherein the one or more sensors may include a temperature sensor, a voltage sensor, or other sensor. In some embodiments, the device or system 600 may include a power source such as a battery 640 to power the device or system 600. The power source may further include a solar cell, a fuel cell, a charged capacitor, near field inductive coupling, or other system or device for providing or generating power. The power provided by the power source may be distributed as required to elements of the device or system 600.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, read-only memory (ROM), random access memory (RAM), erasable programmable read-only memory (EPROM), electrically-erasable programmable read-only memory (EEPROM), magnetic or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

In some embodiments, a package includes a substrate; a silicon interconnect bridge including a plurality of interconnections, the interconnect bridge being embedded in the substrate; and a plurality of contacts on a surface of the substrate, the plurality of contacts being coupled with the plurality of interconnections of the interconnect bridge, wherein the interconnect bridge is bonded in a cavity in the substrate, the cavity being formed by removal of at least one temporary structure from the substrate.

In some embodiments, the package further includes two or more dies coupled to the surface of the substrate, the two or more dies being connected by the silicon interconnect bridge, a first die being coupled to a first set of the plurality of contacts and a second die being coupled with a second set of the plurality of contacts.

In some embodiments, the at least one temporary structure includes sacrificial material. In some embodiments, the sacrificial material includes a material that decomposes upon the application of a decomposition condition. In some embodiments, the sacrificial material includes a material that decomposes upon the application of a thermal condition.

In some embodiments, the package further includes dielectric material at least partially surrounding the interconnect bridge.

In some embodiments, the interconnect bridge is an Embedded Multi-Die Interconnect Bridge (EMIB).

In some embodiments, a method includes fabricating a package substrate; placing at least one temporary structure in a first location on the substrate; applying a first dielectric material to the substrate, the laminating of the dielectric material including surrounding at least in part the at least one temporary structure; removing the at least one temporary structure from the package substrate to generate a cavity in the substrate; bonding an interconnect bridge in the cavity, the interconnect bridge including a plurality of interconnections; applying a second dielectric material to the substrate; and installing a plurality of contacts to a surface of the substrate, the plurality of contacts being coupled with the interconnect bridge.

In some embodiments, removing the at least one temporary structure includes applying a condition to change a form of the at least one temporary structure.

In some embodiments, the at least one temporary structure includes a volume of sacrificial material.

In some embodiments, applying the at least one temporary structure includes stencil-printing or photo-defining the sacrificial material.

In some embodiments, sacrificial material includes a sacrificial polymer.

In some embodiments, removing the at least one temporary structure include decomposing the sacrificial material to generate the cavity in the first location. In some embodiments, decomposing the sacrificial material includes applying a decomposition condition to the substrate. In some embodiments, applying the decomposition condition to the substrate includes applying a thermal condition to the substrate.

In some embodiments, the method further includes removing remaining dielectric material subsequent to removing the at least one temporary structure.

In some embodiments, removing remaining dielectric material includes performing laser drilling to remove remaining dielectric material subsequent to removing the at least one temporary structure.

In some embodiments, the method further includes performing laser cutting of the dielectric material prior to removing the at least one temporary structure. In some embodiments, removing remaining dielectric material includes picking dielectric material from the cavity subsequent to removing the at least one temporary structure.

In some embodiments, the method further includes laminating a dry film resist (DFR) and performing copper plating to generate a set of copper pads. In some embodiments, the method further includes laser drilling to form vias for connection to the copper pads.

In some embodiments, a product is produced by a process including fabricating a package substrate; placing at least one temporary structure in a first location on the substrate; applying a first dielectric material to the substrate, the laminating of the dielectric material including surrounding at least in part the at least one temporary structure; removing the at least one temporary structure from the package substrate to generate a cavity in the substrate; bonding an interconnect bridge in the cavity, the interconnect bridge including a plurality of interconnections; applying a second dielectric material to the substrate; and installing a plurality of contacts to a surface of the substrate, the plurality of contacts being coupled with the interconnect bridge.

In some embodiments, removing the at least one temporary structure includes applying a condition to change a form of the at least one temporary structure. In some embodiments, the at least one temporary structure includes a volume of sacrificial material.

In some embodiments, a system includes a multi-die package including: a substrate, a silicon interconnect bridge including a plurality of interconnections, the interconnect bridge being embedded in the substrate, and a plurality of contacts on a surface of the substrate including a first set of contacts and a second set of contacts, the plurality of contacts being coupled with the plurality of interconnections of the interconnect bridge; a plurality of components including at least a first die and a second die, the first die coupled with the first set of contacts and a second die coupled with the second set of contacts, the embedded interconnect bridge to provide interconnects between the first die and the second die; and a touch screen display to display data processed at least in part by the plurality of components, wherein the interconnect bridge is bonded in a cavity in the substrate, the cavity being formed by removal of at least one temporary structure from the substrate.

In some embodiments, the at least one temporary structure includes sacrificial material.

In some embodiments, the first die and second die are coupled by flip chip coupling with the first set of contacts and the second set of contacts.

What is claimed is:

1. A method comprising:
fabricating a package substrate;
placing at least one temporary structure in a first location on the package substrate;
subsequent to placing the at least one temporary structure in the first location on the package substrate, applying a first dielectric material to the package substrate, to surround at least a portion of the at least one temporary structure;
subsequent to applying the first dielectric material to the package substrate, removing the at least one temporary structure from the package substrate to generate a cavity in the package substrate, wherein a portion of the first dielectric material remains over the cavity subsequent to removing the temporary structure;
removing the portion of the first dielectric material from over the cavity;
subsequent to removing the portion of the first dielectric material from over the cavity, bonding an interconnect bridge in the cavity, the interconnect bridge including a plurality of interconnections;
applying a second dielectric material to the package substrate; and
installing a plurality of contacts to a surface of the package substrate, the plurality of contacts being coupled with the interconnect bridge.

2. The method of claim 1, wherein removing the at least one temporary structure includes applying a condition to change a form of the at least one temporary structure.

3. The method of claim 2, wherein the at least one temporary structure includes a volume of sacrificial material.

4. The method of claim 3, wherein applying the at least one temporary structure includes stencil-printing or photo-defining the sacrificial material.

5. The method of claim 3, wherein the sacrificial material includes a sacrificial polymer.

6. The method of claim 3, wherein removing the at least one temporary structure include decomposing the sacrificial material to generate the cavity in the first location.

7. The method of claim 6, wherein decomposing the sacrificial material includes applying a decomposition condition to the package substrate.

8. The method of claim 7, wherein applying the decomposition condition to the package substrate includes applying a thermal condition to the package substrate.

9. The method of claim 1, further comprising removing remaining dielectric material subsequent to removing the at least one temporary structure.

10. The method of claim 9, wherein removing remaining dielectric material includes performing laser drilling to remove remaining dielectric material subsequent to removing the at least one temporary structure.

11. The method of claim 9, further comprising performing laser cutting of the dielectric material prior to removing the at least one temporary structure.

12. The method of claim 11, wherein removing remaining dielectric material includes picking dielectric material from the cavity subsequent to removing the at least one temporary structure.

* * * * *